March 2, 1971 A. O'CONE 3,566,458

METHOD OF ENCAPSULATING A TRANSISTOR

Filed May 22, 1968

United States Patent Office 3,566,458

Patented Mar. 2, 1971

3,566,458

METHOD OF ENCAPSULATING A TRANSISTOR

Attillio O'Cone, Concord, N.H., assignor to Sprague Electric Company, North Adams, Mass.

Filed May 22, 1968, Ser. No. 731,100
Int. Cl. B01j *17/00;* H01l *1/10*
U.S. Cl. 29—588 6 Claims

ABSTRACT OF THE DISCLOSURE

The method of encapsulating a transistor involving mounting a transistor to the lead posts of a header. The header is a plurality of lead posts fixed in position by a first insulative material. Encapsulating the transistor in a second insulative material and selectively solvent removing the first insulative material.

BACKGROUND OF THE INVENTION

This invention relates to an improved method of encapsulating a transistor.

A common practice in the art of encapsulating transistors involves the use of a header which consists of a plurality of lead posts which are molded in position usually by an insulative material. The lead posts can be coplanar or can be arranged in delta fashion. It is also common practice to reverse the positions of two of the leads on the transistor side of the header in order to accommodate particular electrical contacting arrangements of a customer. The plate or disc of the header can be made of any nonconducting material and in some cases it is intended to be removed from the leads after the leads have been welded to the transistor and after the transistor has been encapsulated in a suitable encapsulant. One practice is to remove the header by fracturing the header and removing it from about the leads. This practice however involves the danger of misaligning the leads and also of the danger of opening a leakage path along the lead into the encapsulated transistor.

It is an object of the present invention to present an improved technique of removing the insulative material of the header without damaging the electrical contacts within an encapsulated transistor.

This and other objects will become apparent from the following description and accompanying drawing.

SUMMARY OF THE INVENTION

This invention is concerned with a method of encapsulting a transistor including the steps of mounting at least one transistor via electrically conductive bonds to the lead posts of the header. The header is a plurality of lead posts fixed in position by a first insulative material. The transistor is encapsulated in a second insulative material. The first insulative material is selectively removed by means of a solvent. The first and second insulative materials can be selected from the two major groupings of organic polymers known as thermoplastic and thermosetting resins or polymers respectively. In a more limited embodiment the first insulative material is a polyolefin and the second insulative material is an epoxy resin. In a preferred embodiment of the invention the polyolefin is polypropylene and the epoxy resin is an acid anhydride hardenable resin. The preferred solvent for selectively removing the polypropylene is decalin, otherwise known as decahydronaphthalene. The solvent removal of the polypropylene is greatly facilitated by the use of heated decalin.

DETAILED DESCRIPTION OF THE INVENTION

Figure 1:
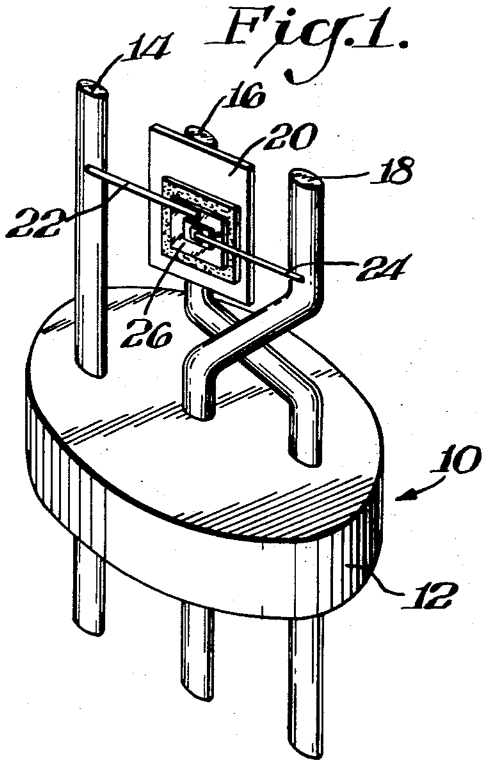
FIG. 1 is a perspective view of the header assembly having a transistor mounted thereon.
Figure 2:
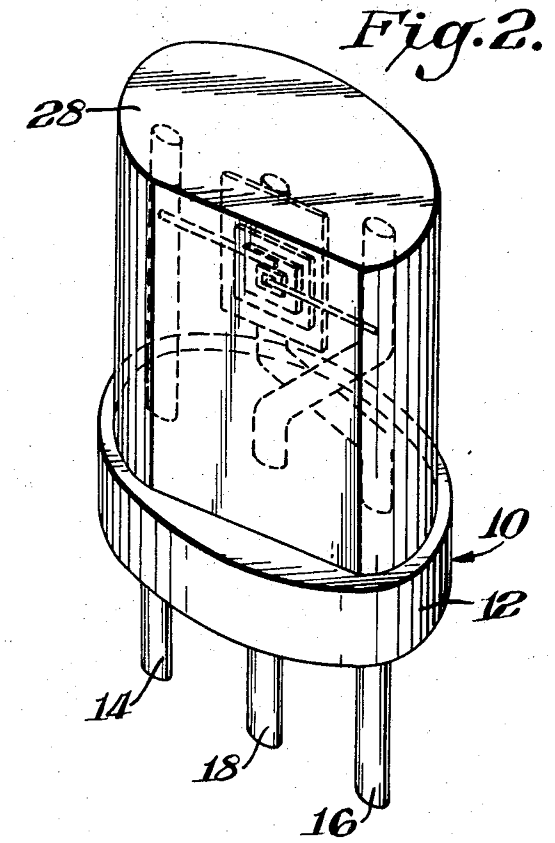
FIG. 2 is a perspective view of the header assembly after an encapsulating material has encapsulated the transistor and leads.
Figure 3:
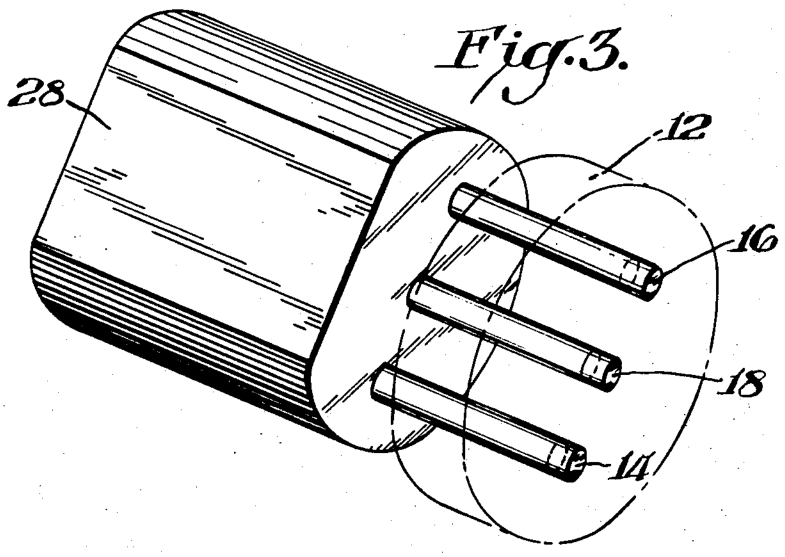
FIG. 3 is a perspective view depicting the solvent removal of the insulative material of the header.

The present invention is based upon the use of two different insulative materials, one for the header and the other as the encapsulant for the transistor. The process will be described with reference to the drawing. A transistor 26 is bonded to a metallic plate 20. The plate 20, in turn, is bonded to the central post 16 of a header assembly 10. The header assembly 10 consists of three lead posts 14, 16 and 18 fixed in position by means of a first insulative material 12. One suitable first insulative material is a polypropylene known by the trade name "Eastman Tenite Plastic Polypropylene 4240" available commercially from the Eastman Chemical Products Corp. Whisker leads 22 and 24 make electrical connection from transistor 26 to lead posts 14 and 18 respectively. FIG. 2 shows the transistor unit after a second insulative material 28 has been completely molded about the lead posts and the mounted transistor 26. One suitable second insulative material is an acid anhydride hardenable epoxy resin known by the trade name "Hysol C7–5441 Black Casting Compound" available commercially from the Hysol Corp. After this stage of the process, the encapsulated transistor unit is immersed into a solvent which selectively dissolves only the first insulative material 12. The unit is then rinsed in fresh solvent, dried and, if necessary, the second insulative material is subjected to a heat treatment to effect the curing thereof. The unit is then ready for testing.

While the drawing shows a header assembly having only three leads, it is to be understood that the header assembly can have any number of leads to accommodate one or more transistors. Also while the header assembly shows that lead posts 16 and 18 are bent into different positions in order to accommodate a particular transistor structure or to follow the design of a particular customer, it is to be understood that the leads can be not only parallel but coplanar.

In a preferred embodiment the first insulative material of header 10 is polypropylene (which is decalin soluble) and the second insulative material is an acid anhydride hardenable epoxy resin (which is Decalin insoluble). After the mounted transistor is encapsulated in the acid anhydride hardenable epoxy resin, the unit is immersed in decalin and the decalin is heated up to about 150° C. to facilitate dissolution and removal of the polypropylene. Final hardening of the epoxy is effected by heating the unit in an oven. In addition to the acid anhydride hardenable epoxy resin, other resins such as amine cured epoxy resins, phenol-formaldehyde resins, etc. can be employed. The important limitations for the second insulative material are, it must be an excellent protective encapsulant for the transistor and it must be comparatively insoluble in the solvent used to remove the first insulative material.

The precise sequence of steps will depend somewhat upon the physical characteristics of the two different insulative materials employed. In the preferred embodiment it will be noted that the final hardening of the epoxy occurred after solvent removal of the polypropylene. This sequence is necessary because the curing temperature would char and melt the polypropylene if it were present. It is possible, however, to use a material which cures or gels at temperatures below the melting or decomposition point of the polypropylene.

Since it is obvious that many changes and modifications can be made in the above-described details without departing from the nature and spirit of the invention it is to be understood that the invention is not limited to said details except as set forth in the appended claims.

What is claimed is:

1. In a method of encapsulating a transistor the steps of (a) mounting at least one transistor via electrically conductive bonds to the lead posts of a header, said header being a plurality of lead posts fixed in position by a thermoplastic first insulative material; (b) encapsulating said transistor and said lead posts in a thermosetting second insulative material; and (c) then selectively solvent removing said thermoplastic first insulative material by immersing the encapsulated transistor in a solvent in which said thermosetting second insulative material is insoluble.

2. The method of claim 1 wherein said thermoplastic first insulative material is a polyolefin and said thermosetting second insulative material is an epoxy resin.

3. The method of claim 2 wherein said polyolefin is polypropylene and said resin is an acid anhydride hardenable epoxy resin.

4. The method of claim 3 wherein said solvent is Decalin.

5. The method of claim 4 wherein said removal is assisted by heating the Decalin.

6. The method of claim 5 wherein said epoxy resin is heat-treated after removal of the polypropylene to speed the hardening thereof.

References Cited

UNITED STATES PATENTS

| | | | |
|---|---|---|---|
| 2,757,439 | 8/1956 | Burns | 29—588 |
| 3,091,553 | 5/1963 | Matsumoto | 156—2X |
| 3,439,235 | 4/1969 | Lanzl et al. | 29—590X |

JOHN F. CAMPBELL, Primary Examiner

W. TUPMAN, Assistant Examiner

U.S. Cl. X.R.

264—272; 317—234